(12) United States Patent
Conroy et al.

(10) Patent No.: US 10,750,632 B1
(45) Date of Patent: Aug. 18, 2020

(54) MOUNTING SYSTEM FOR COMPONENT RACK

(71) Applicant: Amazon Technologies, Inc., Seattle, WA (US)

(72) Inventors: Ryan F. Conroy, Seattle, WA (US); Ryan Monaghan, Seattle, WA (US); Christopher Strickland Beall, Woodinville, WA (US); Darin Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/368,572

(22) Filed: Mar. 28, 2019

(51) Int. Cl.
*H05K 7/14* (2006.01)
*A47B 88/40* (2017.01)
*A47B 57/30* (2006.01)

(52) U.S. Cl.
CPC ............ *H05K 7/1489* (2013.01); *A47B 57/30* (2013.01); *A47B 88/40* (2017.01)

(58) Field of Classification Search
CPC ........ H05K 7/1489; A47B 88/40; A47B 57/30
See application file for complete search history.

(56) References Cited

U.S. PATENT DOCUMENTS

| 5,599,080 | A * | 2/1997 | Ho ........................ | G11B 33/124 312/334.7 |
| 7,059,897 | B2 * | 6/2006 | Smith .................... | F16M 13/02 439/527 |
| 2002/0108914 | A1 * | 8/2002 | Abbott ..................... | H02B 1/36 211/26 |
| 2006/0187631 | A1 * | 8/2006 | Muenzer ................. | G06F 1/181 361/685 |
| 2008/0128578 | A1 * | 6/2008 | Wu ........................ | G11B 33/128 248/694 |
| 2015/0098186 | A1 * | 4/2015 | Alshinnawi ............. | G06F 1/183 361/679.58 |
| 2016/0363965 | A1 * | 12/2016 | Hsu ......................... | G06F 1/182 |
| 2017/0055361 | A1 * | 2/2017 | Muhsam ............... | H05K 7/1489 |
| 2018/0242477 | A1 * | 8/2018 | Gupta ................. | H05K 7/20736 |
| 2019/0124783 | A1 * | 4/2019 | Chapel ................. | H05K 7/1489 |

\* cited by examiner

*Primary Examiner* — Daniel P Wicklund
*Assistant Examiner* — Sagar Shrestha
(74) *Attorney, Agent, or Firm* — Kilpatrick Townsend & Stockton LLP

(57) ABSTRACT

A datacenter component rack may be used to mount electronic components. The datacenter component rack may include support surfaces which are evenly spaced on each side of the component rack. The support surfaces may form uniform slots for receiving the electronic components. The electronic components may include flanges for mounting the electronic components in the uniform slots. The flanges may be on each side of the electronic component and engage the support surfaces in the datacenter component rack. The flanges may support the electronic component after they have engaged with the support surfaces.

20 Claims, 3 Drawing Sheets

MOUNTING SYSTEM FOR COMPONENT RACK

BACKGROUND

A datacenter is a facility used to house a collection of datacenter electronic components such as computer servers and associated components, such as network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a pertinent part of the cost of operating a datacenter relates to the costs of installing or removing the electronic components from server racks. Such costs may be incurred during initial installation of the electronic components in the server racks, replacement of electronic components, or when reorganizing the electronic components within the server racks.

BRIEF DESCRIPTION OF THE DRAWINGS

Various embodiments in accordance with the present disclosure will be described with reference to the drawings, in which.

DETAILED DESCRIPTION

Figure 1:
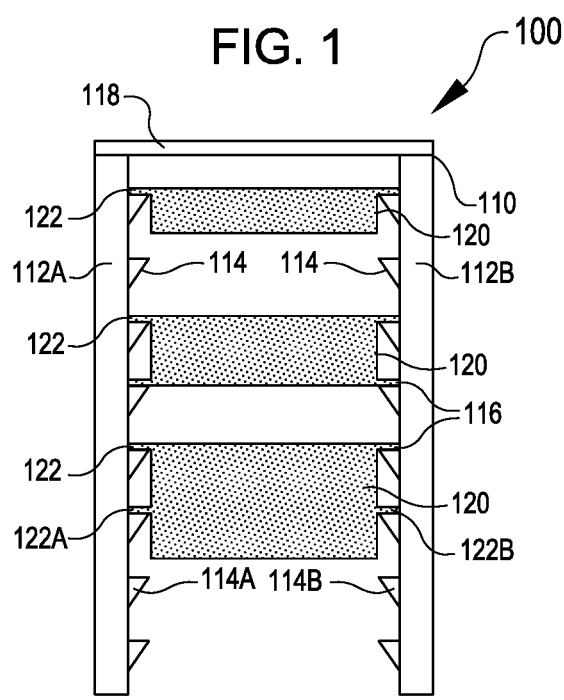
FIG. 1 illustrates a front view of a component rack system including a datacenter component rack and associated electronic components illustrating example universal mounting systems in accordance with various embodiments.

Embodiments and techniques described herein are directed to component racks with mounting hardware and electronic components, such as servers, mounted therein. For example, the electronic components can be mounted in slots of uniform height ("uniform slots") that are provided along the height of the component rack. The uniform slots can be defined by mounting surfaces coupled with the sides of the component rack. The electronic components can include support flanges that can engage with the uniform mounting surfaces of the component rack and allow for the installation of the electronic components without using specialized mounting hardware. For example, an electronic component can be mounted in the component rack by sliding the component into the component rack such that the support flanges of the electronic component are engaged with the mounting surfaces of the component rack.

In an example embodiment, the component rack can include support surfaces for mounting electronic components. The support surfaces can be mounted on either side of the component rack, in opposing pairs, so as to support both sides of the electronic component. The support surface pairs can be mounted along the height of the component rack walls in a uniform pattern, such as consistently spaced along the height of each side of the rack, creating uniform slots on opposite sides of the rack. The electronic components can include flanges for engaging with the component rack support surfaces. The flanges can be mounted on each side of each electronic component and slidingly engage a set of support surfaces so that the support surfaces support an electronic component, via the flanges, when the electronic component is installed in the component rack.

Because embodiments described herein allow for installation of datacenter electronic components via mounting in uniform slots, no custom hardware is required for mounting. In various examples, the height of the uniform slots in the component rack and the height of the electronic components are measured in rack units (abbreviated as "RU" or "U"). For example, the slot can have a height including but not limited to ½ unit (0.5 RU) or 1 unit (1 RU). In various embodiments, a rack unit is 44.45 mm however a rack unit may be defined as more or less.

The height of the slot and the height of the electronic components may be different. The electronic components can have a height smaller than the height of the slot and up to the height of the component rack. For example, the slot may have a height of 0.5 RU and the electronic component may have a height of 4 RU. In some embodiments, multiple support flanges can be mounted on both sides of the electronic component. The multiple flanges can be evenly spaced to match the height of the slot. For example, for a rack having slots that are 0.5 RU in height and an electronic component with a height of 4 RU, the electronic component may have multiple support flanges attached on each side of the electronic component and spaced apart in the vertical direction by 0.5 RU, the same height as each slot. The electronic component could then be mounted in the component rack with eight flanges on each side engaging eight supports.

In various embodiments the electronic component may include tabs for securing the electronic component after it has been mounted in the component rack. One or more tabs may be mounted on either side of the electronic component and interface with notches in the component rack. Once engaged, the tabs and notches may aid in preventing the electronic components from moving.

In various embodiments the component rack includes a mounting lattice for supporting electronic component connectors. In some examples, connectors can be provided that are mounted at regular intervals along the height of the lattice and are designed to be connected to connectors on installed electronic components. The connectors may include a quick-disconnect coupling extending from the lattice that engages with an opposing quick disconnect coupling on an electronic component that is mounted in the component rack. The electronic components may include connection hardware, such as the quick disconnect couplings, that can automatically interface with the electronic component connectors as a result of an electronic component being installed. For example, an electronic component may be mounted in the component rack and automatically connect to the electronic component connectors during installation, such that a technician does not have to manually connect wires to the electronic component.

In the description herein, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates a front view of a component rack system 100 including a datacenter component rack 110 and associated electronic components 120 in accordance with embodiments. The datacenter component rack system 100 may include the component rack 110 designed to accept electronic datacenter components 120 of varying sizes and/or at varying locations. The example depicted in FIG. 1 shows three electronic datacenter components 120 of different sizes. However, the electronic components 120 may all be the same size. Additionally or alternatively, there may be more or less than three electronic components 120 mounted in the component rack 110.

The component rack 110 can be a rack suitable for supporting electronic components. For example, the component rack 110 can be a server rack. The rack 110 may also be a cabinet rack, shelving, transport racks, portable racks, wall mount racks, telco racks or open frame racks.

The electronic component 120 may be hardware suitable for computing, storage, networking, or powering such equipment. For example, the electronic components 120 may be or contain components of a server. The electronic components 120 may additionally or alternatively be or contain JBODs, network switches, automatic transfer switches (ATSes), power distribution units (PDUs), or any other electronic equipment that is mountable in a component rack 110.

One or more datacenter component rack systems 100 may be located in a datacenter. In various embodiments, the datacenter component rack systems 100 may include component racks 110 that vary in size and/or shape. In various embodiments, the datacenter component rack systems 100 may be positioned in rows to create walkways for technicians to access the electronic components 120. The datacenter component rack systems 100 may be located adjacent to other component racks of various shapes and designs.

As shown in FIG. 1, the component rack 110 is formed by a set of sidewalls (e.g., individually marked as a left wall 112A and a right wall 112B), for example, which can define opposite sides of a substantially cuboid or rectangular shape. The sidewalls 112 are spaced apart to form an opening which can receive electronic components 120. The sidewalls 112 are connected via a support structure 118 that keeps the sidewalls 112 supported and aligned parallel to each other. As depicted, the support structure 118 is located at the top of the sidewalls 112. However, the support structure 118 may be located at the bottom of the sidewalls 112 or at locations along the back of the component rack 110. Additionally or alternatively, more than one support structure 118 can be used to fix the sidewalls 112 in position relative to each other.

In various embodiments, the component rack 110 can be formed or coupled with support surfaces 114, including multiple support surfaces 114 attached on the inside of each of the sidewalls 112. As depicted in FIG. 1, the support surfaces 114 may be positioned as opposing pairs (e.g., a left support surface 114A mounted on the left sidewall 112A and an opposing right support surface 114B mounted at the same height on the right support surface 112B). The support surfaces 114 may be attached to the sidewalls 112 in a repeating pattern, such that the support surfaces 114 are separated by the same distance. For example, the support surfaces 114 may be separated by a distance of 0.5 RU. However, the support surfaces 114 may be separated by any acceptable distance.

The support surfaces 114 may be attached along the entire height of each of the side walls 112. As depicted, the support surfaces 114 are attached to the sidewalls 112 in a repeating, consistently-spaced pattern that goes the entire height of each sidewall. However, the support surfaces 114 may only be positioned on a portion of the height of the sidewall 112 or there may only be one support surface 114 on each sidewall 112.

The support surfaces 114 may span the entire depth of the component rack 110 (e.g., the entire distance from the front of the component rack 110 to the back of the component rack 110), or any portion thereof. In some embodiments, the support surfaces 114 span only a portion of the depth of the component rack 110 (e.g., only part of the distance from the front of the component rack 110 to the back of the component rack 110). For example, the support surfaces 114 may only span half the distance between the front of the component rack 110 and the back of the component rack 110.

Opposing pairs of the support surfaces 114 may be attached to the opposite sidewalls 112 in a repeating pattern. Slots 116 are formed between sets of opposing support surfaces 114. As is described in more detail below, depending upon the height of an electronic component 120, the electronic component 120 can be fit into one or more slots 116. In an example, the slots 116 each have a height of 0.5 RU and are spaced along the entire height of the component rack 110. In some embodiments, the slots are spaced at different heights along the height of the sidewalls. For example, the pattern may have three slots 116, each 0.5 RU, and then have a 1 RU gap before having three more 0.5 RU slots. This alternate spacing allows larger sized electronic components 120 to be fit in some areas, and smaller electronic components 120 to fit in other areas.

The support surface 114 may be a C-shaped channel with a single support surface 115. Additionally or alternatively, the support surface 114 may be an S-shaped bracket, a bracket with a T-shaped opening, or any shape suitable for engaging with a flange 122. The support surface 114 may have more than one support surface 115. For example, the top surface and the bottom surface of the C-shaped support surface 114 may both be support surfaces 115. Support surfaces 114 on opposing sides of the component rack 110 may have different shapes and/or different numbers of support surfaces. For example, the left support surface 114A may be a C-shaped support surface 114 with a single support surface 115 and the right support surface 114B may be an S-shaped support surface 114 with multiple support surfaces 115.

The electronic component 120 may be a variety of heights and/or may be a height that spans one or more slots 116. For example, the electronic component 120 may have a height of 1 RU and be mounted in two slots 116, each with a height of 0.5 RU. The electronic components 120 may additionally or alternatively have a height that is less than the height of a single slot 116. For example, the slot 116 may have a height of 0.5 RU and the electronic component 120 may have a height of 0.25 RU.

In various embodiments, the electronic component 120 may include an enclosure surrounding some or all of the electronics. The enclosure can be a structure with sidewalls able to couple with the flanges 122. The enclosure may include a top and a bottom in addition to the sidewalls. The enclosure may be a chassis, a box, a surround, and/or another structure at least partially surrounding the electronics in the electronic component 120.

As described above, in embodiments, each electronic component 120 includes flanges 122 mounted on opposite sides of the electronic component. The flanges 122 may engage with the support surfaces 114 at certain points to slidingly support the electronic component 120. In various embodiments, a single flange 122 is mounted on each side of an electronic component 120 (e.g., as shown in FIG. 1, a left flange 122A engaged with a left support surface 114A and a right flange 122B engaged with a right support surface 114B). In these embodiments, the electronic component 120 is supported by the single set of opposing flanges 122A and 122B. Alternatively, an electronic component 120 can be supported by multiple sets of flanges 122. As shown in FIG. 1, two of the electronic components 120 have multiple flanges 122. The multiple flanges 122 may be attached to the sides, top, and/or the bottom of the electrical component. In some embodiments, multiple flanges 122 are spaced on each side of the electronic component in a pattern along the height of the electronic component 120. The pattern may be the same as the pattern of the support surfaces 114 in the component rack 110. Additionally or alternatively, the flanges 122 may be spaced at distances to engage with every other pair of support surfaces 114 or some other combination of support surfaces 114.

In some embodiments, the flange 122 is connected to the side of the electronic component 120, however, the flange 122 may be formed as part of the electronic component 120 enclosure. The flange 122 engages with the support surfaces 114 to support the electronic component 120 in the component rack 110. The flange 122 may support the electronic component 120 when the electronic component 120 is installed in the component rack 110. The electronic component 120 may be installed in the component rack 110 by sliding the component in the front of the component rack 110. Additionally or alternatively, the electronic component 120 may be mounted in the component rack 110 through the top and/or bottom of the component rack 110.

Figure 2:
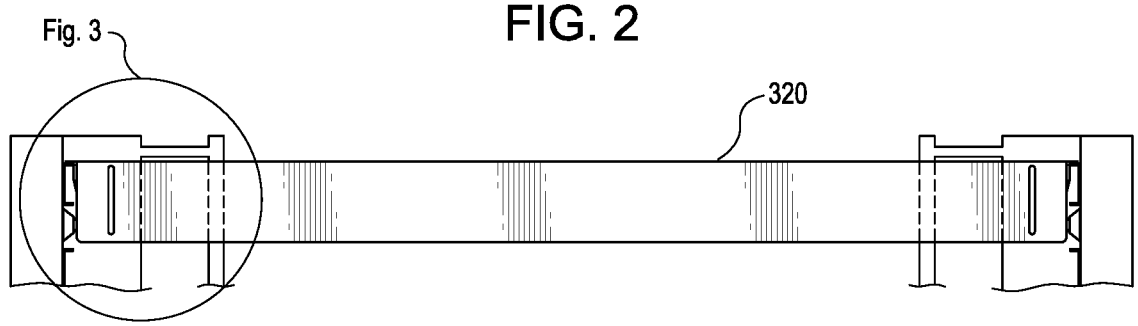
FIG. 2 illustrates a front view of an electronic component mounted in a rack, in accordance with various embodiments.

FIG. 2 illustrates a front view of an embodiment of an electronic component 320 mounted in a rack, similar to the electronic components 120 of FIG. 1.

Figure 3A:
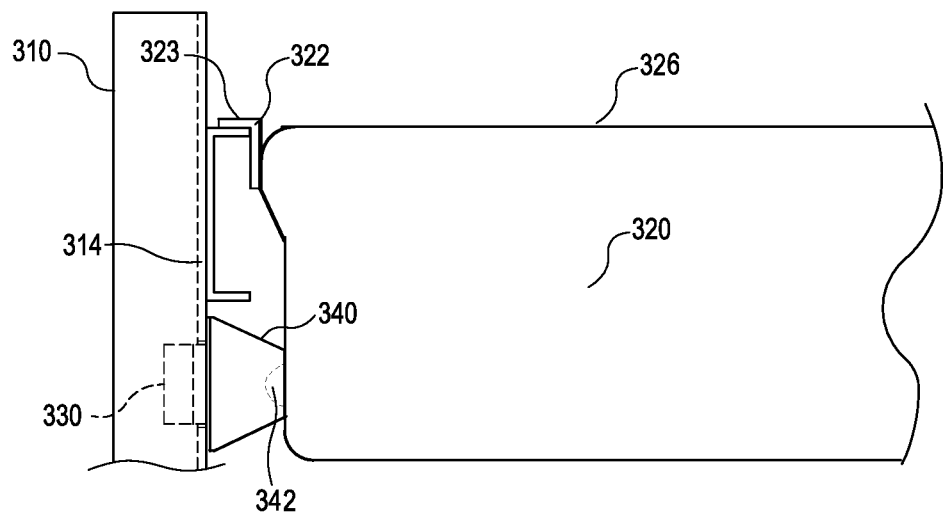
FIGS. 3A and 3B illustrate a detail view of a portion of the component rack system of FIG. 1 showing an example universal mounting system.
Figure 3B:
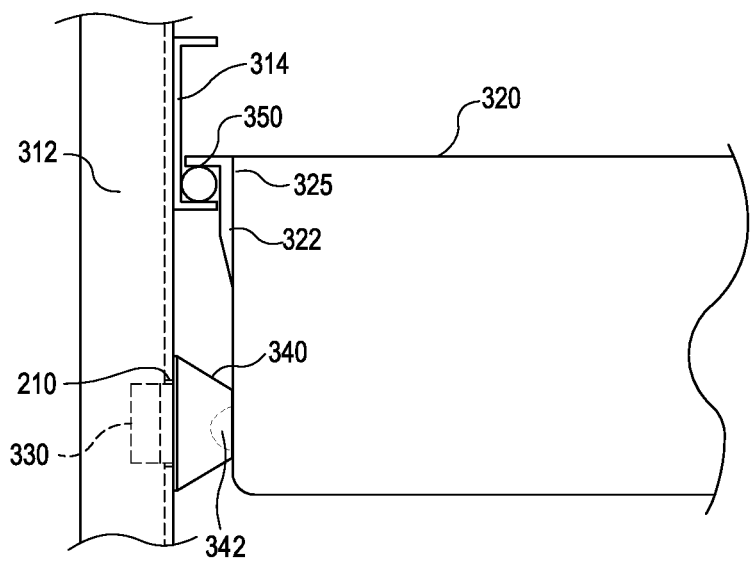

FIGS. 3A and 3B illustrate a detail view of a portion of the component rack 310 and electronic components 320 of FIG. 2. In FIGS. 2, 3A, and 3B, the support surface 114 is provided as the top edge of a channel 314. As best shown in FIGS. 3A and 3B, the support surface 314 is a C-shaped channel. The channel 314 can be made out of the same material as the component rack 310 or may be made out of material that is different than the material used to make the component rack 310. As examples, the channel 314 may be made out of metal, carbon fiber, rubber or plastic.

In the embodiment shown in FIG. 3B, the channel 314 includes a bearing 350. The bearing 350 is positioned on the bottom interior of the channel 314 and provides the support surface for the flange 322. The bearing 350 can be a ball-bearing or any low-friction bearing surface that allows for sliding engagement between the channel 314 and the flange 322. Thus, the bearing 350 allows the electronic component 320 to be more easily slid into and out of the component rack 310.

More than one flange 322 may be attached or integrated into the electronic component 320 to support the electronic component 320 when mounted in the component rack 310. In the embodiments of FIGS. 3A and 3B, the electronic component 320 is supported on each side by a single flange 322 engaged with the channel 314, although for clarity the right-hand side is not shown in these views.

In various embodiments, the electronic component 320 may include a protrusion 342 that assists in holding the electronic component 320 in place after it has been mounted in the component rack 310. The protrusion 342 can be a rounded bump, as depicted in FIGS. 3A and 3B, or it can take other forms, such as a fin designed to sit in a slot. As depicted, the protrusion 342 extends from the sidewall of the electronic component 320 and engages with a tab 340 in the sidewall 312. The tab 340 may be made of plastic or another material with flexibility that allows it to engage with the protrusion 342 and with a notch 330 in the sidewall 312 of the rack 310. For example, the tab 340 may be made of plastic that receives the protrusion 342 and also snaps into the notch 330, thereby holding the electronic component 320 in place. The tab 340 may additionally or alternatively engage with the notch 330 via mounting hardware and/or adhesives. Additionally or alternatively, the notch 330 may be a slot, hole, or opening that allows the tab 340 to engage with the sidewall 312. In further embodiments, instead of or in addition to the component 320 having a protrusion 342 that is configured to extend into a tab 340, the component 320 has an indentation or hole in its sidewall into which the tab 340 extends when the component is fully seated in the rack, thereby holding the component 320 in place.

In some embodiments, the tab 340 may provide a notification that the electronic component 320 is properly mounted and/or the flange 322 is engaged with the channel 314. For example, the tab 340 may provide an audible click or tone to provide audible feedback that the electronic component 320 is fully seated in the component rack 310.

In some embodiments, a pattern of tabs 340 and notches 330 may be used to hold the electronic component 320 in place. For example, a series of tabs 340 may extend vertically along the side of the electronic component 320, from the front of the electronic component 320 to the back. A series of matching notches 330 may be in the sidewalls 312 and engage with the tabs 340. In some embodiments the sidewalls 312 may have more notches 330 than the electronic components 320 have tabs 340.

In some embodiments, the electronic component 320 may include a flange 322 with an engagement surface 323 and an attachment surface 325 (FIG. 3B). The engagement surface 323 extends mostly horizontally and outward from the electronic component 320 so that the engagement surface 323 can extend over and engage and be supported by the channel 314. The engagement surface 323 can be made of the same material as the flange 322. Additionally or alternatively, the engagement surface 323 may contain a low-friction material that aids in the sliding engagement between the engagement surface 323 and the channel 314. The attachment surface 325 extends along the side of the electronic component 320 and includes hardware necessary to attach the flange 322 to the electronic component 320. For example, the attachment surface 325 may include, screws, bolts, or magnets.

The flange 322 as depicted is a separate piece of material that has been attached to the side of the electronic component 320. However, in alternate embodiments, a structure can be provided that is attached to the top and/or the bottom of the electronic component 320 and that provides the function of the flange 322. The flange 322 may be attached to the electronic component 320 via attachment hardware and/or adhesion. In some embodiments, the flange 322 is integrated into the enclosure of the electronic component 320. For example, the flange 322 may be an extension of the top of the electronic component 320, such that, the top extends beyond one sidewall 312 and the other sidewall 312 to create the two flanges.

In various embodiments, the electronic component 320 can include a lid 326 (FIG. 3A). The lid 326 can provide additional stiffness to the electronic component 320 and prevent the electronic component 320 from sagging when support by the flanges 322. For example, when the electronic component is supported by a flange 322 mounted to either sidewall, the sidewalls can bend inwards toward the middle of the electronic component 320 due to the weight. However, the lid 326 can act against this inward bending and prevent the electronic component 320 from sagging. The lid 326 may also act as protection for the electronic component 320. The lid 326 may be made of the same material as the rest of the electronic component 320 or may include stronger material than the rest of the electronic component 320.

In some embodiments, the sidewalls of the electronic component 320 may slope outwards to accommodate the lid 326. As illustrated in FIG. 3A, the sidewall of the electronic component 320 slopes outward to allow the lid 326 to contact the sidewall and sit beneath the height of the sidewall. The lid 326 may be engaged with a relatively straight sidewall or a sidewall that slopes inward.

Figure 4:
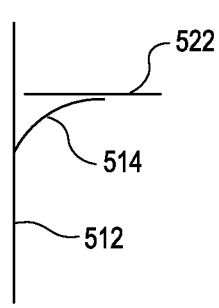
FIGS. 4-6 illustrate front views of different examples of a sidewall, support surface and flange of the component rack system of FIG. 1.
Figure 5:
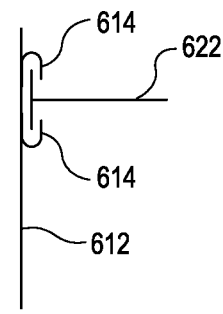
Figure 6:
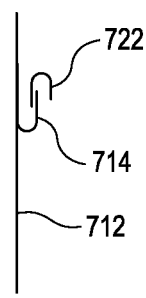

FIGS. 4-6 depict front views of various embodiments for sidewalls 112, support surfaces 114, and flanges 122. FIG. 4 depicts an embodiment including a sidewall 512 of a rack, where a support surface 514 curves away from the sidewall 512. A flange 522 of an electronic component (not shown) engages with the support surface 514 to support the electronic component 120, as described above.

FIG. 5 depicts an embodiment including a sidewall 612 of a rack. In this embodiment, two C-shaped support surfaces 614 extend outward from the sidewall and extend up and down, facing each other, so that a channel is formed with an opening away from the sidewall. A flange 622 is attached to an electronic component (not shown) and extends between the channel formed by the two support surfaces 114. The flange 622 includes upper and lower extensions to form a T-shaped flange. However, the flange 622 may be any shape for engaging with one or both sides of the support surface 614.

As depicted in FIG. 6, an upwardly-curved support surface 714 extends outward from a sidewall 712. A flange 722 includes a downward facing curve that engages with the support surface 714 and support the electronic component 120.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
    a server rack comprising:
        first and second opposing vertical supports defining an opening;
        a plurality of tabs on each of the first and second vertical supports within the opening; and
        a plurality of pairs of support surfaces, each pair of support surfaces comprising one support surface mounted on the first vertical support and another support surface mounted on the second vertical support, the pairs being equally spaced along a height of the supports; and
        a server mounted in the server rack opening, the server comprising:
            a chassis comprising first and second opposing sidewalls;
            protrusions extending from the first and second opposing sidewalls and configured to engage with respective tabs of the plurality of tabs when the server is installed in the server rack; and
            for each sidewall, a flange coupled with the sidewall and extending laterally outward from the sidewall, the flanges on opposing sidewalls engaging a pair of support surfaces of the plurality of pairs of support surfaces, the flanges and the pair of support surfaces being arranged so that the flanges engage the pair of support surfaces during installation of the server to slidingly support the server when the server is installed in the server rack.

2. The system of claim 1, wherein the tabs are removable from the respective first and second vertical supports and prevent the flanges from disengaging with the pair of support surfaces when the server is installed in the server rack.

3. The system of claim 1, wherein the server includes respective flanges coupled with each sidewall, each of the flanges engaged with a respective support surface when the server is disposed in the server rack.

4. The system of claim 1, wherein the server is a first server and the system further comprises a second server mounted in the server rack, the second server comprising:
   a chassis comprising first and second opposing sidewalls; and
   for each sidewall, a flange coupled with the sidewall and extending laterally outward from the sidewall, the flanges on opposing sidewalls engaging a second pair of support surfaces on the server rack, the flanges and the second pair of support surfaces being arranged so that the flanges engage the second pair during installation of the server to slidingly support the second server when the second server is installed in the server rack.

5. The system of claim 1, wherein the pairs of support surfaces are vertically spaced along the vertical supports at 0.5 U intervals.

6. The system of claim 5, wherein pairs of support surfaces are vertically spaced along the height of the vertical supports at intervals of greater than 0.5 U.

7. The system of claim 1, wherein the plurality of tabs extend into openings in the first and second vertical supports, each of the tabs defining an opening at one end for receiving at least a portion of a protrusion and wherein each of the tabs are moveable from a first opening along the height of the supports to a second opening along the height of the supports.

8. A component rack, comprising:
   first and second opposing vertical supports;
   a plurality of tabs engaged with interior surfaces of each of the first and second vertical supports; and
   a plurality of pairs of opposing support surfaces mounted on the first and second vertical supports, the pairs being spaced along at least part of a height of the first and second vertical supports, the pairs of opposing support surfaces thereby forming slots for receiving electronic components at locations along the height of the component rack, a pair of opposing support surfaces of the plurality of pairs of opposing support surfaces configured to receive an electronic component comprising flange pairs and protrusions, wherein the flange pairs and the protrusions extend outward relative to respective sidewalls of the electronic component, and wherein the protrusions are configured to engage with respective tabs of the plurality of tabs when the electronic component is installed within a slot of the rack.

9. The component rack of claim 8, wherein at least one of the pairs of opposing support surfaces comprises at least one of a C-shaped bracket or a U-shaped bracket.

10. The component rack of claim 8, wherein one of the pairs of opposing support surfaces is a first shape and a different one of the pairs of opposing support surfaces is a second shape that is different than the first shape.

11. The component rack of claim 8, wherein one of the pairs of opposing support surfaces spans only a portion of a distance from a front of the component rack to a rear of the component rack.

12. The component rack of claim 8, wherein one of the pairs of opposing support surfaces further comprises a bearing for engaging with a flange.

13. The component rack of claim 8, wherein the pairs of opposing support surfaces are spaced along only part of the height of the vertical supports.

14. The component rack of claim 8, wherein the plurality of tabs are engaged with the first and second vertical supports in a plurality of tab pairs, each tab pair comprising a first tab engaged with the first vertical support and a second tab engaged with the second vertical support.

15. The electronic component of claim 14, wherein at least one of the plurality of tab pairs are removable from a first engagement position and positionable at a second engagement position for engagement with the first and second vertical supports.

16. An electronic component, comprising:
   a chassis with first and second opposing sidewalls;
   protrusions extending from the first and second opposing sidewalls configured to engage with respective tabs of a plurality of tabs mounted on opposing sides of a component rack when the electronic component is installed in the component rack; and
   a first flange extending outward relative to the first sidewall and a second flange extending outward relative to the second sidewall, the first and second flanges configured to engage with respective support surfaces mounted on opposing sides of the component rack to slidingly support the electronic component when the electronic component is installed in a slot of the component rack.

17. The electronic component of claim 16, further comprising a lid spanning the first and second sidewalls of the chassis, a side of the lid contacting at least the first or the second sidewall when the electronic component is installed in the slot of the component rack.

18. The electronic component of claim 17, wherein a portion of the first and second sidewall flares outward allowing the lid to engage with and sit below a height of the first and second sidewalls.

19. The electronic component of claim 16, wherein the first and second flanges have a T-shape.

20. The electronic component of claim 16, wherein the first and second flanges extend at least a portion of a distance from a front of the electronic component to a back of the electronic component.

* * * * *